United States Patent [19]

Shibata et al.

[11] Patent Number: 4,683,384
[45] Date of Patent: Jul. 28, 1987

[54] INTEGRATED CIRCUIT HAVING INPUT AND OUTPUT DRIVERS CASCADED BETWEEN I/O PADS AND INTERNAL CIRCUITRY

[75] Inventors: Manabu Shibata; Akira Uragami, both of Takasaki, Japan

[73] Assignee: Hitachi, Ltd., Tokyo, Japan

[21] Appl. No.: 895,216

[22] Filed: Aug. 11, 1986

[30] Foreign Application Priority Data

Aug. 9, 1985 [JP] Japan .............................. 60-174133

[51] Int. Cl.[4] ................. H03K 17/693; H03K 19/094
[52] U.S. Cl. .................................. 307/475; 307/443; 307/446; 307/465; 307/303; 364/491; 364/900
[58] Field of Search ............... 307/440, 443, 446, 465, 307/468-469, 475, 303; 364/489-491, 900 MS File

[56] References Cited

U.S. PATENT DOCUMENTS

| | | | |
|---|---|---|---|
| 4,350,906 | 9/1982 | Gillberg | 307/469 |
| 4,479,067 | 10/1984 | Fujita | 307/475 |
| 4,523,106 | 6/1985 | Tanizawa et al. | 364/490 X |
| 4,575,646 | 3/1986 | Saneski | 307/443 |
| 4,600,995 | 7/1986 | Kinoshita | 364/491 |
| 4,612,466 | 9/1986 | Stewart | 307/443 X |

FOREIGN PATENT DOCUMENTS 0028726 2/1984 Japan .................................. 307/446

OTHER PUBLICATIONS

Vicary, "Semiconductor Chip Layout of a Driver/Receiver Circuit", IBM T.D.B., vol. 19, No. 10, Mar. 1977, pp. 3739-3740.

Primary Examiner—Stanley D. Miller
Assistant Examiner—D. R. Hudspeth
Attorney, Agent, or Firm—Antonelli, Terry & Wands

[57] ABSTRACT

An integrated circuit having the circuit construction wherein a plurality of each of input and output circuits are formed in such a manner as to form pairs and to correspond to a plurality of external connection pads, respectively, and are used selectively to replace the function of an internal circuit. A signal transmission path of an input circuit formed so as to correspond to an external connection pad to which an external input signal is applied at an input portion and at least part of a signal transmission path of an output circuit formed so as to correspond to the external connection pad are connected in series between the external connection pad and an input terminal of the internal circuit in order to use the signal transmission function of the output circuit as the function of the internal circuit. At an output portion, on the other hand, at least part of the signal transmission path of an input circuit formed so as to correspond to an external connection pad for delivering an output signal to the outside and a signal transmission path of an output circuit formed so as to correspond to the external connection pad are connected in series between the output terminal of the internal circuit and the external connection pad in order to use the signal transmission function of the input circuit as the function of the internal circuit.

14 Claims, 14 Drawing Figures

INTEGRATED CIRCUIT HAVING INPUT AND OUTPUT DRIVERS CASCADED BETWEEN I/O PADS AND INTERNAL CIRCUITRY

BACKGROUND OF THE INVENTION

This invention relates generally to an integrated circuit. More particularly, the present invention relates to technique which can be applied effectively to an integrated circuit having regions in which a plurality each of input and output circuits can be formed in such a manner as to form pairs that correspond to a plurality of external connection pads, respectively, such as gate arrays.

Integrated circuits (which will also be called "ICs" hereafter) can be broadly classified into ICs having high versatility, such as standard logic semiconductor integrated circuits, and custom ICs, such as gate arrays, that are produced in accordance with customers' requirements. Being mass-produced, versatile ICs are economical but are not free from the problem that a large number of ICs are necessary in order to form circuits that are required by customers. The custom ICs are produced in order to solve this problem. Various contrivances are made to the custom ICs in order to satisfy customers' requirements. An example of such contrivances can be seen in ICs for gate arrays.

In a typical gate array, a large number of buffer portions are formed around an internal circuit which includes a large number of basic cells. The internal circuit includes a large number of basic cells in order to easily form a logic circuit required by a customer, and the desired logic circuit can be constituted within a short period by connecting these basic cells by aluminum wirings, whenever necessary. The buffer portions have an input circuit region and an output circuit region so that the input and output circuits can form pairs which correspond to a plurality of external connection pads, and that the arrangement of the input-output pins can be obtained easily as stipulated by the customer. When the corresponding external connection pads are input pins, only the input circuit region is used with the output circuit region being not used. When the corresponding external connection pads are output pins, on the contrary, only the output circuit region is used while the input circuit region is not used.

In other words, in accordance with ordinary methods, only an input circuit is connected between an external connection pad, to which an input signal is applied from outside, and an input terminal of an internal circuit when the input signal is applied to the pad. When an output signal is taken out from the external connection pad, on the other hand, only an output circuit which is formed so as to correspond this pad is connected between an output terminal of the internal circuit and this external connection pad.

The utilization ratio of an internal circuit portion has become extremely high as the scale of systems is ever-increasing. However, only a predetermined number of basic cells, which are contained in the internal circuit, are disposed on one main plane of a substrate. On the other hand, as to the buffer portion, the utilization ratio is low and many useless regions are contained as described above.

The present invention contemplates to improve the substrate utilization ratio of custom ICs such as gate arrays.

SUMMARY OF THE INVENTION

It is a primary object of the present invention to provide a technique which can improve the substrate utilization ratio and the circuit function of an integrated circuit as a whole.

The above and other objects and novel features of the present invention will become more apparent from the following description when taken in conjunction with the accompanying drawings.

Among the inventions disclosed herein, the following is a typical example.

A plurality of each of input and output circuits are disposed on the main surface of a substrate in such a manner as to form pairs that correspond to a plurality of external connection pads, respectively, and are used selectively, and the signal transmission function of the non-selected input or output circuits (which are not used in the prior art circuits) is used as part of the functions of an internal circuit.

A more definite example is as follows.

At an input portion, a signal transmission path of an input circuit formed so as to correspond to an external connection pad to which an external input signal is applied, and at least part of a signal transmission path of an output circuit formed so as to correspond to the external connection pad are connected in series between the external connection pad and an input terminal of the internal circuit in order to use the signal transmission function of the output circuit as the function of the internal circuit.

At an output portion, on the other hand, at least part of the signal transmission path of an input circuit formed so as to correspond to an external connection pad for delivering an output signal to the outside and a signal transmission path of an output circuit formed so as to correspond to the external connection pad are connected in series between the output terminal of the internal circuit and the external connection pad in order to use the signal transmission function of the input circuit as the function of the internal circuit.

The non-selected input and output circuits, that are not used in the prior art, are positively used in the present invention to eliminate the useless space on the substrate and to improve the substrate utilization ratio. Furthermore, even when the utilization ratio of the internal circuit is high, at least part of the signal transmission function of the input and output circuits can easily replace the function of the internal circuit.

The two methods described above can be applied to all the input circuits and output circuits that are formed so as to correspond to the external connection pads, but can of course be applied to at least one of these external connection pads. In such a case, an ordinary method can be applied to those portions to which the present invention is not applied.

DESCRIPTION OF THE PREFERRED EMBODIMENTS

Hereinafter, preferred embodiments of the present invention will be described with reference to the accompanying drawings.

Incidentally, like reference numerals are used to identify like constituents throughout the drawings.

Figure 1:
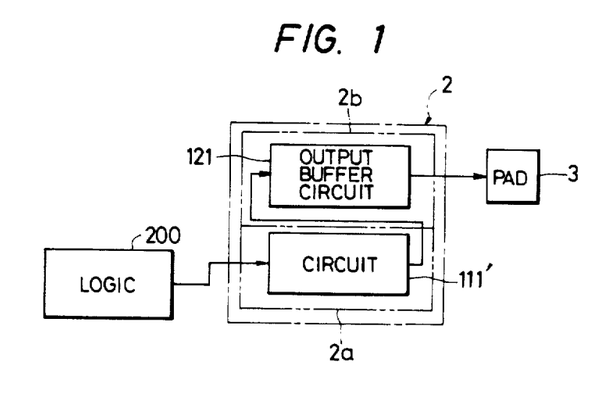
FIG. 1 is a conceptual view showing one embodiment of the present invention.

First of all, FIG. 1 shows an example of the principal portions of an integrated circuit (hereinafter called "IC" or "semiconductor integrated circuit device").

This drawing shows the portions close to an I/O (input/output) buffer portion 2 of a semiconductor integrated circuit device in which a gate array is formed. The buffer portion 2 is disposed between an internal circuit 200 and an external connection pad 3. A region 2a for an input buffer circuit (111) as an input circuit and a region 2b for an output buffer circuit 121 as an output circuit are formed as a pair on one main surface of a substrate of the buffer portion 2 which is disposed in such a manner as to correspond to the external connection pad 3.

Circuit elements (such as diodes, transistors, resistors, etc.) for constituting the input buffer circuit (111) are formed in the region 2a, while circuit elements for constituting the output buffer circuit 121 are formed in the region 2b.

Here, the buffer portion 2 shown in FIG. 1 is used as an output buffer portion. Therefore, the output buffer portion 121 is formed in the region 2b, while all the circuit elements of the input buffer circuit (111) are not connected in the region 2a. Instead, a circuit 111' formed by connecting part of the circuit elements of the input buffer circuit (111) is formed in the region 2a where the input buffer circuit (111) is to be formed. In other words, the circuit 111' formed in the region 2a is utilized as a substitute for basic cells in the internal circuit 200.

That is to say, at least a part of a signal transmission path between the input and output of the input circuit, which is formed in such a manner as to correspond to the external connection pad 3 (the signal transmission path of the circuit 111'), and a signal transmission path between the input and output of the output circuit 121 formed in such a manner as to correspond to the pad 3 are connected in series between the output terminal of the internal circuit 200 and the pad 3, so that the output signal of the output circuit 121 is responsive to the output signal from the output terminal of the internal circuit 200 in the signal transmission relation that is determined by the signal transmission function of the input circuit (the circuit 111') and the signal transmission function of the output circuit 121, and the output signal of the output circuit 121 is delivered from the external connection pad 3 outside the integrated circuit IC.

In the embodiment shown in the drawing, the signal transmission function of the circuit 111' formed by use of a part of the input circuit is utilized as a substitute for the logical function of the internal circuit 200.

As described above, since at least part of the circuit elements for constituting the input buffer circuit (or the output buffer circuit) inside the buffer portion 2 is utilized in place of the basic cells inside the internal circuit 200, it becomes possible to more effectively utilize the circuit elements inside the buffer portion 2, to increase the number of basic cells that can be utilized in practice, and to improve the function of a gate array having the same scale.

Next, the construction of the gate array to which the technique described above can be applied will be explained.

Figure 2:
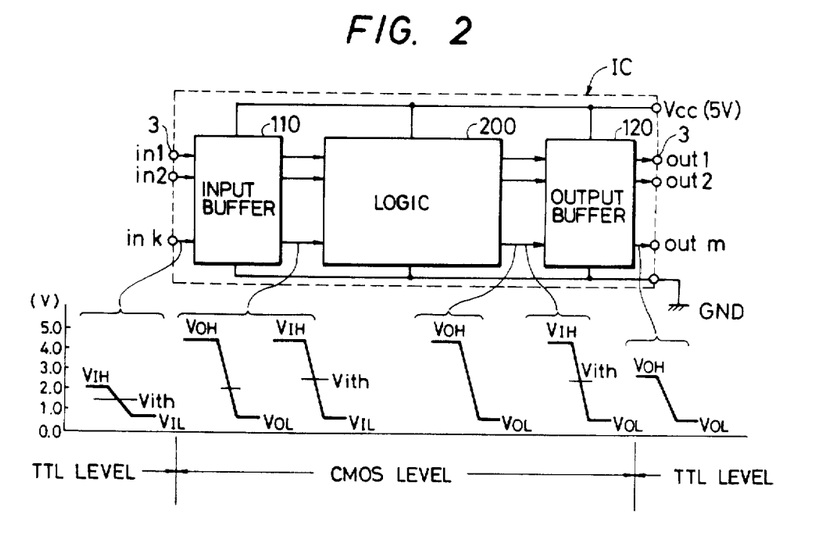
FIG. 2 is a block diagram showing a gate array to which the present invention is applied.

FIG. 2 shows the outline of the gate array.

As shown in the drawing, an input buffer portion 110 and output buffer portion 120 are formed together with an internal circuit 200 in a semiconductor integrated circuit device IC in which the gate array is constituted. The input and output buffer portions 110 and 120 are interposed between external connection pads 3 and the internal circuit 200, respectively, and function as buffers involving level conversion.

In FIG. 2, symbol $V_{ith}$ represents an input threshold value, $V_{IH}$ is an input logic level at the time of a high (H) level, $V_{OH}$ is an output logic level at the time of the high (H) level, $V_{IL}$ is an input logic level at the time of a low (L) level and $V_{OL}$ is an output logic level at the time of the low (L) level.

Symbols in1~ink represent logic inputs to the outside and out1~outm represent logic outputs to the outside.

As can be seen clearly from the drawing, in the gate array in this embodiment, the logic input/output to the outside is at a TTL level (with the high level of being at least 2.0 V and the low level being up to 0.8 V) while the logic level inside IC is at a CMOS level (with the high level being at least 4.4 V and the low level being up to 0.6 V).

Figure 3:
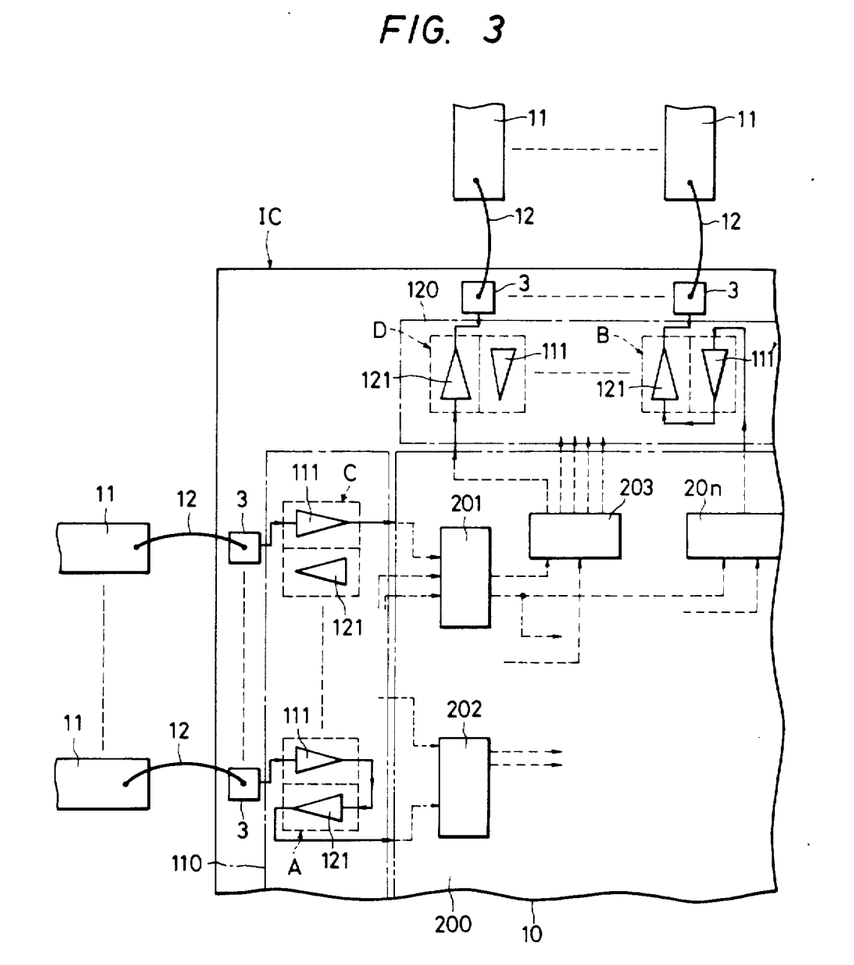
FIG. 3 is a plan view of a device layout showing the internal state of a gate array to which the present invention is applied.

FIG. 3 shows the outline of the circuits inside the semiconductor integrated circuit device IC of FIG. 2.

In the drawing, a large number of logic function units (micro-cells) 201~20n and wirings (dotted lines) for mutually connecting these units are formed inside the internal circuit 200 in accordance with a customer's requirement. In addition, a large number of input buffer circuits 111 are formed in the input buffer portion 110 while a large number of output buffer circuits 121 are formed in the output buffer portion 120 in a corresponding manner.

As can be seen clearly from the diagram, a plurality of input buffer circuits 111 and a plurality of output buffer circuits 121 are disposed on the main surface of the substrate 10 around the internal circuit 200 in such a manner as to form pairs with respect to a plurality of external connection pads 3.

The portions to which the present invention are applied are those represented by symbols A and B in the drawing. In the A portion, the input circuit 111 and the output circuit 121 are interposed in series between the external connection pad 3 and the unit 202 of the internal circuit 200. In the B portion, the input circuit 111' that has been described with reference to FIG. 1 and the output circuit 121 are interposed in series between the output terminal of the unit 20n of the internal circuit 200 and the external connection pad 3. Since the signal transmission path is constituted in this manner, a logic function such as that performed by the internal circuit 200 replaces the normal output signal transmission function of the output circuit 121 in the A portion (and the normal input signal transmission function of the input circuit 111' in the B portion).

As shown further in FIG. 3, only the input circuit 111 is shown disposed between the external connection pad (first pad) 3 and the input terminal of the unit 201 of the internal circuit in the portion represented by symbol C. The input signal is transferred to the unit 201 of the internal circuit 200 without passing through the signal transmission path of the output circuit 121 formed in such a manner as to correspond to ths first pad 3. In the portion represented by symbol D, on the other hand, only the output circuit 121 is shown disposed between the output terminal of the unit 203 of the internal circuit and the external connection pad (second pad) 3, and the output signal of the unit 203 of the internal circuit 200 is transferred to this second pad 3 without passing through the signal transmission path of the input circuit 111 formed in such a manner as to correspond to the second pad 3.

In the arrangement of the present invention, generally the output circuit 121 of the A portion and the input circuit 111' of the B portion will be modified to differ somewhat from the output circuit 121 of the D portion and the input circuit 111 of the C portion. However, at least part of their signal transmission path is utilized which would otherwise be wasted.

In FIG. 3, reference numeral 11 represents a lead and 12 represents a wire. An input signal to IC from outside IC and an output signal from IC to outside IC are applied and taken out, respectively, through the lead 11 and the wire 12.

Circuit examples of the portions represented by A, B, C and D will be described in further detail.

Figure 4:
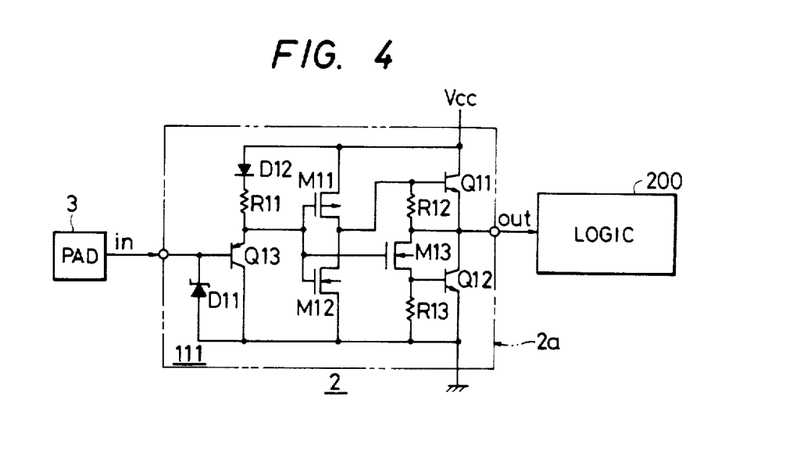
FIG. 4 is a circuit diagram showing an example of an input circuit.

FIG. 4 shows an example of the circuit corresponding to the C portion shown in FIG. 3. The input circuit 111 is comprised of a P-channel MOS field effect transistor $M_{11}$, N-channel MOS field effect transistors $M_{12}$, $M_{13}$, NPN type bipolar transistors $Q_{11}$, $Q_{12}$, a PNP type bipolar transistor $Q_{13}$, diodes $D_{11}$, $D_{12}$ and resistors $R_{11}$, $R_{12}$, $R_{13}$. The PNP transistor $Q_{13}$ as the input stage circuit receives a logic input of the TTL level applied to the external connection pad 3. When the level of the logic input signal is at the low level (L: up to 0.8 V), the PNP transistor $Q_{13}$ becomes conductive and shifts down the level of a CMOS inverter as a next stage circuit comprised of the MOS field effect transistors $M_{11}$, $M_{12}$ to the low level, so that the bipolar transistors $Q_{11}$ and $Q_{12}$ of the totempole output stage are turned on and off, respectively, and the output OUT is shifted up to the high (H) level. When the logic input signal is at the high level (H: at least 2.0 V), the bipolar transistor $Q_{12}$ becomes conductive while $Q_{11}$ becomes non-conductive so that the output OUT falls to the low level. In other words, the signal transmission function of this input circuit 111 is to perform the logic function of an inverter.

A diode $D_{11}$ as an input protection circuit is added to the input buffer circuit 111 shown in FIG. 4. Since the PNP bipolar transistor $Q_{13}$ whose dielectric breakdown strength is greater than that of the MOS transistors $M_{11}$, $M_{12}$ is used as the input stage circuit, the dielectric breakdown strength with respect to static electricity that might be applied from the pad 3 can be improved.

Figure 5:
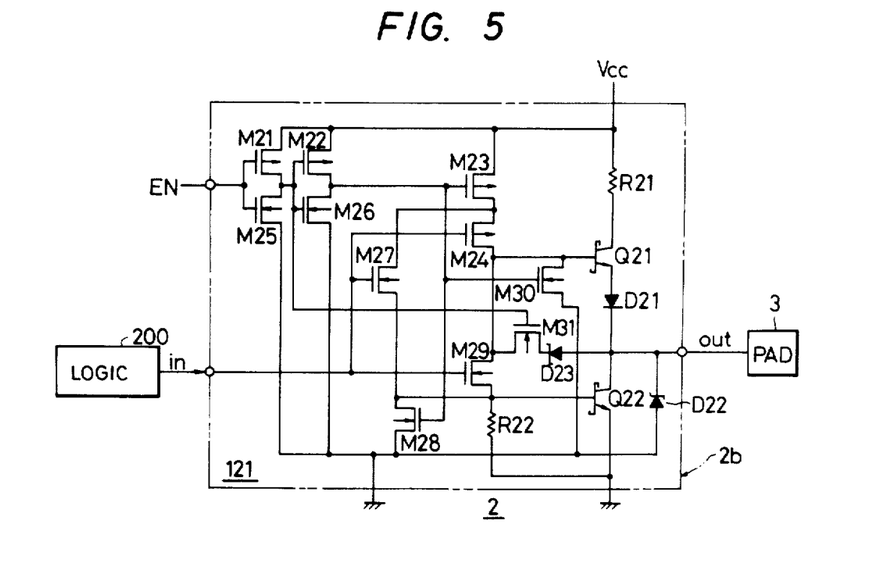
FIG. 5 is a circuit diagram showing an example of an output circuit.

FIG. 5 shows an example of the circuit of the output circuit 121 of the D portion shown in FIG. 3. This output buffer circuit 121 consists of MOS field effect transistors $M_{21} \sim M_{30}$, bipolar transistors $Q_{21}$, $Q_{22}$, diodes $D_{21} \sim D_{23}$ and resistors $R_{21}$, $R_{22}$. This output buffer circuit 121 is a tri-state type inverter, and symbol EN represents a control signal which selects its output state. The MOS field effect transistors $M_{24}$ and $M_{29}$ constitute a CMOS inverter and drives the base electrode of the bipolar transistor $Q_{21}$ by a signal having the opposite phase to that of the input signal. The source-follower transistors $M_{27}$ and $M_{29}$ drive the base electrode of the bipolar transistor $Q_{22}$ by a signal having the same phase as that of the input signal. The source-follower transistor $M_{27}$ is disposed in order to drive the base electrode of $Q_{22}$ at a high level (near a power source voltage $V_{cc}$). The source-follower transistor $M_{29}$ supplies the charge of the output OUT to the base electrode of the bipolar transistor $Q_{22}$ through the diode $D_{23}$ and the source-drain path of the MOS field effect transistor $M_{31}$. As a result, a current which is the product of the charge supplied to the base electrode by the current amplification factor flows through the collector-emitter path of the bipolar transistor $Q_{22}$ and discharges at a high speed the charge of the output OUT.

When the control signal EN is at the high (H) level, both the MOS field effect transistors $M_{28}$ and $M_{30}$ become conductive, and since the base electrodes of the bipolar transistors $Q_{21}$ and $Q_{22}$ fall to the low (L) level, the output OUT of the output circuit 121 is brought into the floating state irrespective of the logic level of the input signal from the input in of the output circuit. When the control signal EN is at the low (L) level, both the transistors $M_{28}$ and $M_{30}$ are non-conductive and the CMOS inverter consisting of the field effect transistors $M_{24}$ and $M_{29}$ becomes operative. When the logic level of the input signal is at the high level, the base electrode of the bipolar transistor $Q_{22}$ is shifted up to the high level, whereby $Q_{22}$ is conductive with $Q_{21}$ being non-conductive, and the output OUT of the output circuit 121 falls down to the low level. When the logic level of the input signal is at the low level, the base electrode of the bipolar transistor $Q_{21}$ is shifted up to the high level, whereby $Q_{21}$ becomes conductive with $Q_{22}$ being non-conductive and the output OUT of the output circuit 121 is shifted up to the high level.

Figure 6:
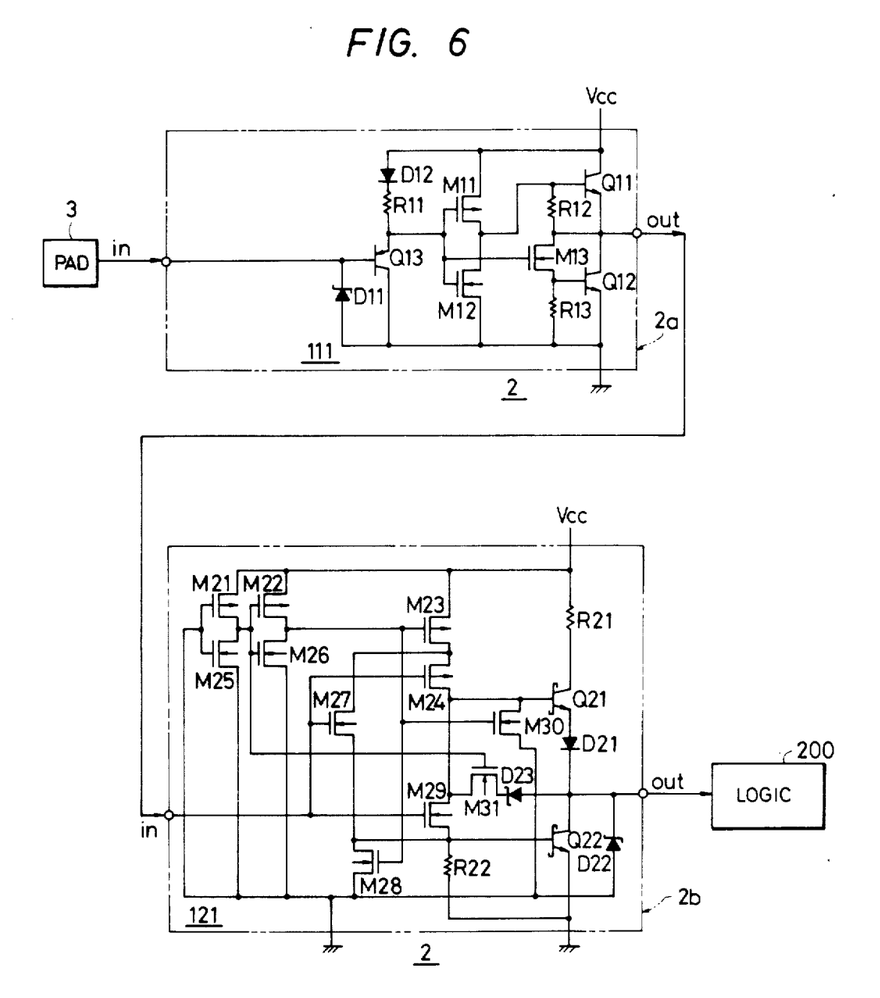
FIG. 6 is a definite circuit diagram showing the circuit portions near an external connection pad portion for input to which the present invention is applied.

FIG. 6 shows an example of the circuit of the A portion shown in FIG. 3. The circuit shown in FIG. 6 consists of the combination of the input buffer circuit 111 and the output buffer circuit 121 shown in FIGS. 4 and 5, respectively. However, there is a difference in that the terminal, to which the control signal EN is applied in FIG. 5, is grounded (to a ground potential GND). Therefore, the output circuit 121 shown in FIG. 6 is an ordinary inverter which will operate at the CMOS levels shown in FIG. 2 rather than converting the CMOS levels to TTL levels. The external input signal applied to the external connection pad 3 passes through the signal transmission path between the input and output of the input buffer circuit 111, then through the signal transmission path of the input and output of the output circuit 121 and is transmitted to the internal circuit 200. In other words, the output signal of the output buffer circuit 121 responds to the external input signal in the signal transmission relation that is determined by the signal transmission function of the input buffer circuit 111 (the inverter) and the signal transmission function of the output circuit 121 (the inverter), and is applied to the internal circuit 200. In this case, the external input signal is transmitted in the same phase to the internal circuit 200 and at the CMOS level.

Figure 7:
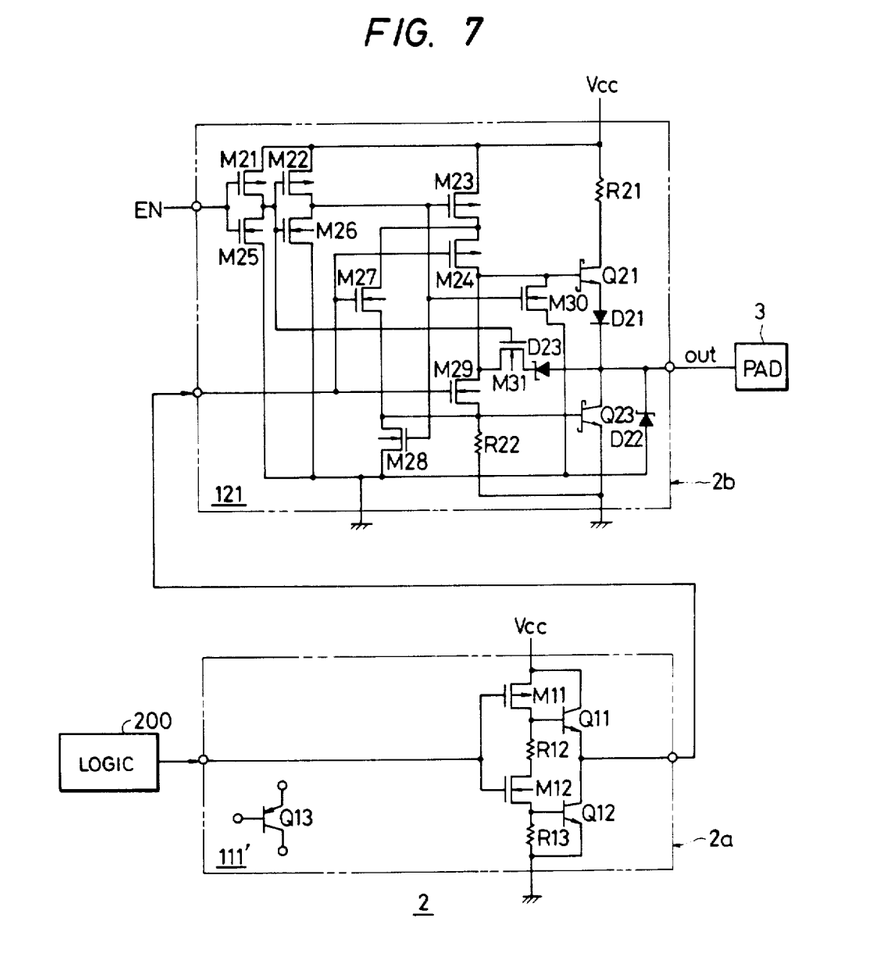
FIG. 7 is a definite circuit diagram showing the circuit portions near an external connection pad portion for output to which the present invention is applied.

FIG. 7 shows an example of the circuit of the B portion shown in FIGS. 1 and 3. The diagram shows an example wherein the output circuit 121 shown in FIG. 5 and the inverter circuit 111' using part of the signal transmission path of the input buffer circuit 111 shown in FIG. 4 are connected. The output signal of the internal circuit 200 passes through part of the signal transmission path of the input buffer circuit 111 (the signal transmission path of the inverter circuit 111') and is then transmitted to the external connection pad 3 through the signal transmission path of the output buffer circuit 121, and delivered outside the integrated circuit. The inverter circuit 111' shown in this drawing consists of the MOS field effect transistors $M_{11}$, the bipolar transistor $Q_{11}$, $Q_{12}$ and the resistors $R_{12}$, $R_{13}$ inside the input buffer circuit 111 shown in FIG. 4. The characterizing feature of this circuit is that the PNP transistor $Q_{13}$ as the input stage circuit of the input buffer circuit 111 is deliberately not connected to at least part of the signal transmission path between the input and output of the input circuit.

The logic input signal supplied to the input terminal in of the input buffer circuit 111 shown in FIG. 4 is a TTL level signal whose high level input voltage $V_{iH}$ is at least 2.0 V and whose low level input voltage $V_{iL}$ is up to 0.8 V. Therefore, the input threshold voltage $V_{ith}$ of the input buffer circuit 111 is set to the range of from 1.3 to 1.5 V between 0.8 V 2.0 V.

The TTL level logic input signal of FIG. 4 is applied to the base electrode of the PNP transistor $Q_{13}$ as the input stage and its level is converted at a base-emitter voltage $V_{BE}$ (=0.7 V) of the PNP transistor $Q_{13}$ and is then applied to the input of the CMOS in verter ($M_{11}$, $M_{12}$). Therefore, the input logic threshold voltage $Y_{ith}$ of the CMOS inverter ($M_{11}$, $M_{12}$) is set to about 2.1 V between 1.5 V and 2.7 V.

On the other hand, the input signal applied to the input of the inverter circuit 111' shown in FIG. 7 is at the CMOS level whose high level input voltage $V_{IH}$ is at least 4.4 V and whose low level input voltage $V_{IL}$ is up to 0.6 V. Therefore, the input logic threshold voltage $V_{ith}$ of the inverter circuit 111' may be set to a voltage ranging from about 2.0 to about 3.0 V between these voltages 4.4 V and 0.6 V. In other words, it is necessary that the PNP transistor $Q_{13}$ be positively disconnected when the CMOS level input signal supplied from the internal circuit 200 is received without changing the input logic threshold voltage of the CMOS inverter shown in FIG. 4. For the reason described above, the inverter circuit 111' shown in FIG. 7 which corresponds at least to part of the signal transmission path of the input buffer circuit 111 shown in FIG. 4 does not use the PNP transistor $Q_{13}$.

Incidentally, in the input circuit 111 of FIG. 4, the ratio W/L between the channel width W and the channel length L of each MOS field effect transistors $M_{11}$, $M_{12}$, $M_{13}$ is set to 30/2, 25/2, 32/2, respectively. Therefore, the MOS field effect transistors to be used for the inverter circuit 111' in FIG. 7 may be $M_{11}$ and $M_{13}$ instead of $M_{11}$ and $M_{12}$. In this case, the ratio W/L of the MOS field effect transistor $M_{11}$ is approximate to that of the MOS field effect transistor $M_{13}$, so that the input logic threshold voltage can be set easily.

By way of example, the inverter circuit 111' shown in FIG. 7 uses the bipolar transistors $Q_{11}$ and $Q_{12}$ of the totempole type output stage of the input buffer circuit 111. However, the output stage circuit of the bipolar transistors $Q_{11}$ and $Q_{12}$ is not always necessary. In other words, it is of course possible to use the inverter circuit comprised only of $M_{11}$ and $M_{12}$ or $M_{11}$ and $M_{13}$.

Besides the effect described in the foregoing "Summary of the Invention", the present invention can be used effectively and advantageously for the following cases.

Figure 8:
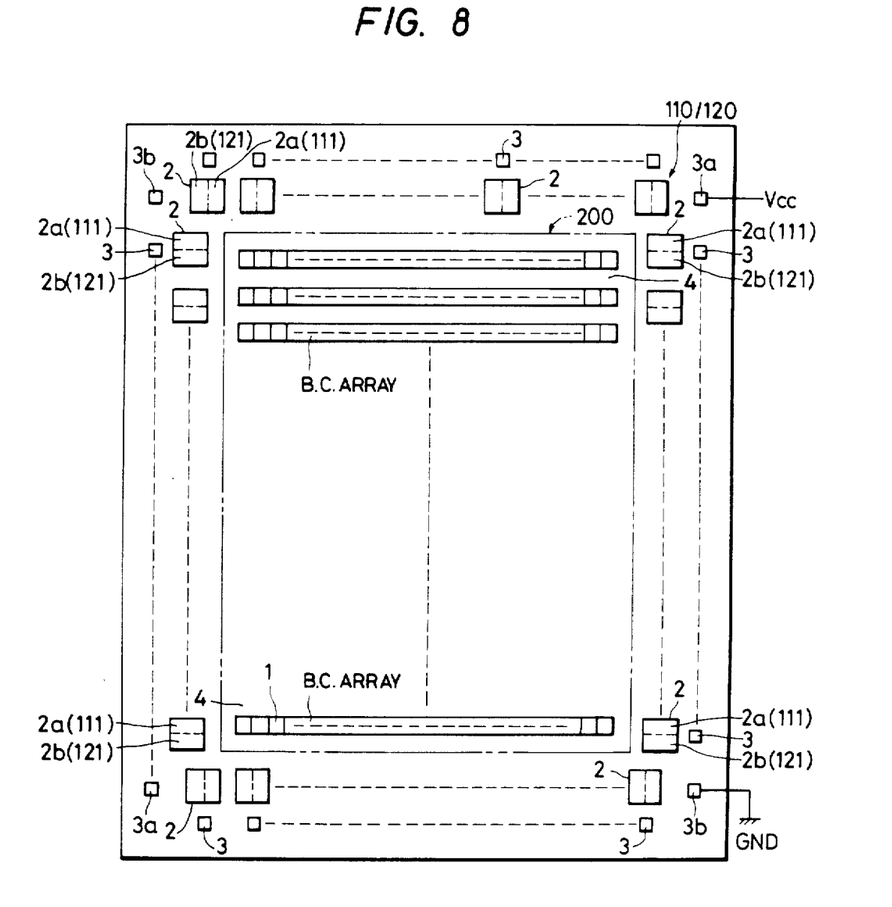
FIG. 8 is a plan view of device layout of a gate array to which the present invention is applied.

Automatic wiring technique using a computer is used for wiring a plurality of basic cells 1 inside the internal circuit 200 (e.g. see FIG. 8). When the utilization ratio of the basic cells inside the internal circuit 200 becomes high, however, the automatic wiring technique cannot sometimes wire the basic cells with one another (i.e., non-wiring occurs). This phenomenon becomes significant particularly when the utilization ratio of the basic cells is as high as 95%, and depends upon the program content of the program of the automatic wiring technique. If the output circuit 121 corresponding to the external connection pad of the input portion and the input circuit 111' corresponding to the external connection pad of the output portion are used to obtain the function of the internal circuit in accordance with the present invention, however, the utilization ratio of the basic cells within the internal circuit 200 drops also even when the automatic wiring technique is used. Incidentally, about two hours' time is necessary for connecting one wiring layer, and the drop of the non-wiring ratio contributes greatly to the reduction of the design time.

Next, the gate array as the application object of the present invention will be described in further detail.

FIG. 8 shows the layout structure of the semiconductor integrated circuit device IC described above.

In the drawing, reference numeral 1 represents each basic cell. Circuit elements necessary for constituting a basic logic circuit, that is, part or the whole of the circuit elements necessary for constituting the basic logic circuit, are formed in this basic cell 1. A great number of basic cells 1 having the same pattern are arranged. Reference numeral 4 represents each wiring region necessary for communicating the basic cells 1 with one another. The logic circuit units (macro-cells) 201~20n shown in FIG. 3 are constituted by use of one or a plurality of basic cells 1.

Reference numeral 2 represents each I/O buffer portion. Either one of the input buffer circuit 111 and the output buffer circuit 121 is selectively formed in the buffer portion 2. A great number of buffer portions 2 are arranged around the internal circuit portion 200. The internal circuit 200 is disposed in order to receive the output signals of a plurality of input circuits and to generate the output signals for driving the inputs of a plurality of output circuits.

Reference numeral 3 represents each external connection terminal pad 3. A great number of terminal pads 3 are arranged outside the buffer portion 2 around the four sides of a rectangular substrate, and are used as the input terminals or the output terminals in accordance with the kind of the circuits formed in the buffer portions 2 at the corresponding positions.

Besides the terminal pads 3 that are used as the input and output terminals, terminal pads 3a, 3b that are used as a power terminal and a ground terminal, respectively, are also provided.

Figure 9:
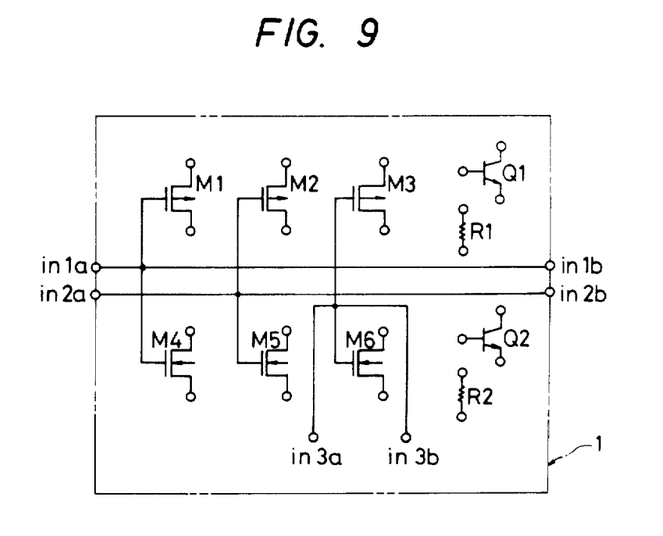
FIGS. 9 to 11 show the construction of basic cells, respectively.
Figure 10:
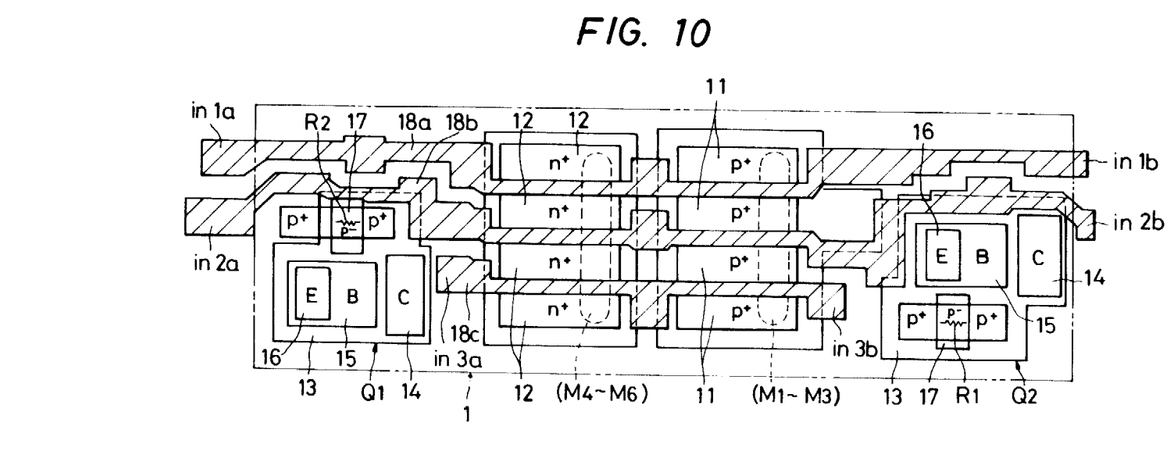
Figure 11:
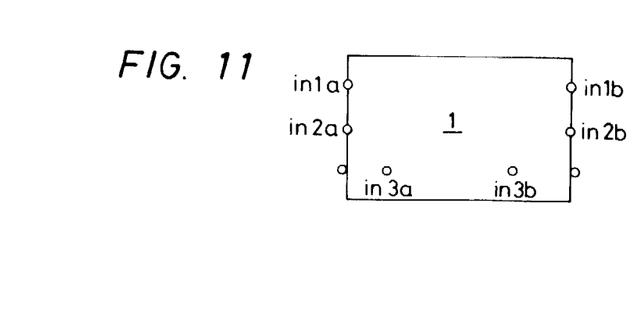

FIGS. 9, 10 and 11 show the content of the basic cell 1 described above.

As shown in FIG. 9, circuit elements necessary for constituting the basic logic circuit, that is, part or the whole of the circuit elements necessary for constituting the basic logic circuit, are formed inside the basic cell 1.

Here, part or the whole of P-channel MOSFETs (MOS field effect transistors) $M_1$, $M_2$, $M_3$, N-channel MOSFETS $M_4$, $M_5$, $M_6$, resistors $R_1$ and $R_2$ and bipolar transistors $Q_1$ and $Q_2$ are formed as shown in FIG. 9.

FIG. 10 shows the layout state of the basic cell 1. In this drawing, reference numeral 11 represents a $P^+$-type diffusion layer forming the source-drain region of the P-channel MOSFETs $M_1$, $M_2$, $M_3$ and 12 represents an $N^+$-type diffusion layer forming the source-drain region of the N-channel MOSFETs $M_4$, $M_5$, $M_6$. Reference numeral 13 represents an $n^-$-type epitaxial layer portion in which the NPN bipolar transistors $Q_1$, $Q_2$ are to be formed, and 14 represents a diffusion layer for current collection of a collector (C) electrode. Reference numeral 15 represents a base (B) diffusion layer, 16 is an emitter (E) diffusion layer and 17 is a p-type diffusion layer for forming the resistors $R_1$, $R_2$. Reference numerals 18a, 18b and 18c represent electrode portions which are made of polycrystalline silicon or the like and serve as the gate electrodes of MOSFETs $M_1 \sim M_6$ and as cell terminal portions in1a, in1b, in2a, in2b, in3a, in3b. In this case, the cell terminal portions in1a, in1b, in2a and in2b are taken outside the basic cell 1, but the terminals in3a and in3b are placed inside the basic cell 1 as hidden terminal portions. They are used for wiring adjacent basic cells with one another, and the like.

FIG. 11 illustrates the basic cell 1 described above as one block, and its explanation is omitted.

Figure 12:
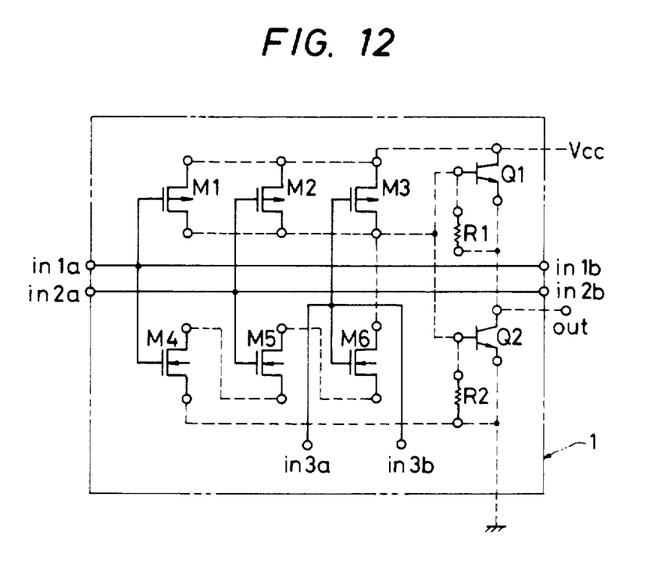
FIGS. 12 and 13 show an example of the circuit constituted by use of the basic cells.
Figure 13:
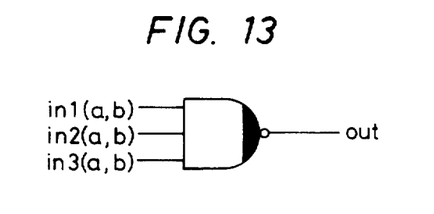

FIGS. 12 and 13 show an example of circuits constituted by the basic cells 1 described above.

FIG. 12 shows a definite circuit diagram of the circuit expressed by logic symbols in FIG. 13. In this circuit, its pre-stage side consists of MOSFETs $M_1 \sim M_6$ that are connected with one another in a complementary arrangement, while its output stage consists of the bipolar transistors $Q_1$ and $Q_2$. This circuit arrangement can accomplish lower power consumption and higher speed operation by higher driving force. Incidentally, the logic symbol whose output side is colored black is hereby assumed to represent a logic circuit whose output stage consists of bipolar transistors.

Figure 14:
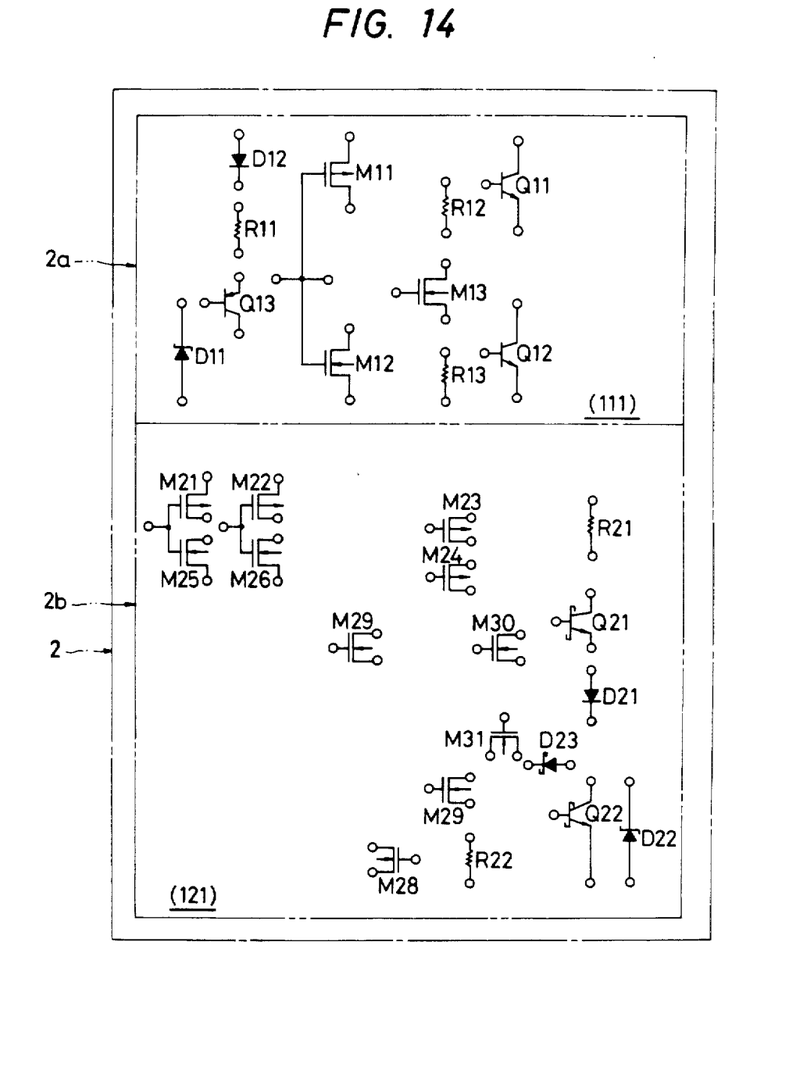
FIG. 14 shows an example of the content of a buffer portion.

FIG. 14 shows in further detail the content of the buffer portion 2 described above prior to wiring connections being made. As shown in this diagram, a pair constituted of a region 2a for the input buffer circuit and a region 2b for the output buffer circuit is formed inside the buffer portion 2.

It can be seen that there are formed inside the region 2a those circuit elements which are necessary for constituting the input buffer circuit (111), that is, part of the whole of MOSFETs $M_{11}$, $M_{12}$, $M_{13}$, the bipolar transistors $Q_{11}$, $Q_{12}$, the diodes $D_{11}$, $D_{12}$ and the resistors $R_{11}$, $R_{12}$, $R_{13}$.

It can also be seen that there are formed inside the region 2b those circuit which are necessary for constituting the output buffer circuit (121), that is, part or the whole of P-channel MOSFETs $M_{21} \sim M_4$, N-channel MOSFETs $M_{25} \sim M_{31}$, the diodes $D_{21} \sim D_{23}$, the resistors $R_{21}$, $R_{22}$ and the bipolar transistor $Q_{21}$, $Q_{22}$.

Next, the effects of the present invention will be described.

(1) In a custom IC having a plurality each of input and output circuits that are arranged on the main plane of the substrate in such a manner as to form pairs corresponding respectively to a plurality of external connection pads such as a gate array, the present invention connects in series the signal transmission path between the input and output of the input circuit corresponding to one of a plurality of external connection pads and at least a part of the signal transmission path between the input and output of the output circuit between one external connection pad described above and one of the input terminals of the internal circuit. Therefore, the signal transmission function of the output circuit can be utilized as part of the functions of the internal circuit. As a result, the utilization ratio of the substrate having formed thereon the integrated circuit can be improved, and hence the circuit function of the integrated circuit can be improved as a whole.

(2) Even when the utilization ratio of the internal circuit is high, part of the signal transmission function of the output circuit can be used as part of the functions of the internal circuit as described in item (1) above. Therefore, even when the logic function determined by the internal circuit proves erroneous, correction can be made by use of the signal transmission function of the output circuit. As a result, the yield of IC can be improved and the necessary design time can be shortened.

(3) At least part of the signal transmission path of the input circuit and the signal transmission path of the output circuit, which is disposed in such a manner as to form a pair together with the input circuit and to correspond to the external connection pad, are connected in series between one of the output terminals of the internal circuit and the external connection pad. According to this circuit arrangement, the signal transmission function of the input circuit can be utilized as part of the functions of the internal circuit, so that the utilization ratio of the substrate having formed thereon the integrated circuit can be improved, and the circuit function of the integrated circuit can as a whole be improved.

(4) The effect described in item (3) provides the effect which is substantially the same as the effect described in item (2).

Although the present invention has thus been described with reference to one preferred embodiment thereof, the invention is not particularly limited thereto but can of course be changed and modified in various manners without departing from the spirit and scope thereof. For instance, the signal transmission function of the input and output circuits may be a linear function instead of a logic function. Furthermore, the logic function of the circuit shown in FIG. 6 is not particularly limited to being an inverter. In other words, the particular elements and circuits shown in the buffers 2 could be changed to allow for other functions while still falling within the scope of this invention in making use of normally unused portions of input or output areas. With regard to FIG. 7, although a two-FET arrangement of $M_{11}$ and $M_{12}$ is shown, the three transistors $M_{11}$, $M_{12}$ and $M_{13}$ could be used together to improve characteristics of the CMOS circuit.

We claim:

1. An integrated circuit comprising:
   (1) a substrate having one main surface;
   (2) a plurality of external connection pads formed on said main surface;
   (3) a plurality of input circuits and a plurality of output circuits formed on said main surface in such a manner as to form pairs that each correspond respectively to one of a plurality of said external connection pads; and (4) an internal circuit disposed on said main surface in such a manner as to receive at input terminals thereof the output signals of a plurality of said input circuits and to generate at output terminals thereof the output signals that drive the inputs of a plurality of said output circuits, wherein each of said input circuits includes an input and an output and elements which can be connected to provide a predetermined signal transmission path between the input and the output to provide a predetermined signal transmission function for said input circuit, wherein each of said output circuits includes an input and an output and elements which can be connected to provide a predetermined signal transmission path between the input and output to provide a predetermined signal transmission function for said output circuit, and wherein the predetermined signal transmission path between the input and output of said input circuit formed so as to correspond to at least one of said external connection pads and at least part of the predetermined signal transmission path between the input and output of said output circuit formed so as to correspond to said one external connection pad are connected in series between said one external connection pad and one of the input terminals of said internal circuit so that the output signal of said output circuit responds to the input signal applied to said one external connection pad in a signal transmission relation determined by the predetermined signal transmission function of said input circuit and the predetermined signal transmission function of said output circuit, and is applied to said internal circuit.

2. An integrated circuit according to claim 1, wherein said input circuit includes an input stage circuit having a PNP transistor, said input stage circuit of said input circuit is used as part of the predetermined signal transmission path between the input and output of said input circuit and the input signal applied to said one external connection pad is applied to the base electrode of said PNP transistor of said input stage circuit.

3. An integrated circuit according to claim 1, wherein the predetermined signal transmission functions of said input circuit and that of said output circuit are logic functions.

4. An integrated circuit according to claim 3, wherein the logic functions of said input and output circuits are inverter functions.

5. An integrated circuit according to claim 1, wherein the rest of said external connection pads other than said one external connection pads among a plurality of said external connection pads include first and second pads; said first pad is connected to the input of said input circuit formed in such a manner as to correspond to said first pad; the output of said input circuit is transmitted to said internal circuit without passing through the predetermined signal transmission path of said output circuit formed in such a manner as to correspond to said first pad; the output signal of said internal circuit is applied to the input of said output circuit formed in such a manner as to correspond to said second pad; and the output of said output circuit is transmitted to said second pad without passing through the predetermined signal transmission path of said input circuit formed in such a manner as to correspond to said second pad.

6. An integrated circuit according to claim 1, 2, 3, 4 or 5, wherein said internal circuit is disposed at the center on the main surface of said substrate which is rectangular; a plurality of each of said input and output circuits are disposed around said internal circuit; and a plurality of said external connection pads are disposed along the four sides of said substrate in such a manner as to correspond to the pairs of said input and output circuits.

7. An integrated circuit according to claim 1, wherein said input circuit corresponding to said one of said external connection pads includes means for converting the input signal applied to said one of said external connection pads to a predetermined operating level and wherein said output circuit formed to correspond to said one external connection pad is arranged to operate at said predetermined operating level and to provide the output signal thereof to said internal circuit at said predetermined operating level.

8. An integrated circuit according to claim 1, wherein said output circuit corresponding to said one of said external connection pads includes means for converting said one output signal of said internal circuit to predetermined operating level, and wherein said input circuit formed to correspond to said one external connection pad is arranged to operate at said predetermined operating level and to provide the output signal thereof to said one external connection pad at said predetermined operating level.

9. An integrated circuit comprising:
(1) a substrate having one main surface;
(2) a plurality of external connection pads formed on said main surface;
(3) a plurality of input circuits and a plurality of output circuits formed on said main surface in such a manner as to form pairs that each correspond respectively to one of a plurality of said external connection pads; and
(4) an internal circuit disposed on said main surface in such a manner as to receive at input terminals thereof the output signals of a plurality of said input circuits and to generate at output terminals thereof the output signals that drive the inputs of a plurality of said output circuits, wherein each of said input circuits includes an input and an output and elements which can be connected to provide a predetermined signal transmission path between the input and the output to provide a predetermined signal transmission function for said input circuit, wherein each of output circuits includes an input and an output and elements which can be connected to provide a predetermined signal transmission path between the input and output to provide a predetermined signal transmission function for said output circuit, and wherein at least part of the predetermined signal transmission path formed between the input and output of said input circuit formed so as to correspond to at least one of a plurality of said external connection pads and the predetermined signal transmission path between the input and output of said output circuit formed so as to correspond to said one external connection pad are connected in series between one of the output terminals of said internal circuit and said one external connection pad, so that the output signal of said output circuit responds to said one output signal of said internal circuit in a signal transmission relation determined by the predetermined signal transmission function of said input circuit and the predetermined signal transmission function of said output circuit, and is applied to said one external connection pad.

10. An integrated circuit according to claim 9, wherein said input circuit includes an input stage circuit having a PNP transistor, and said input stage circuit of said input circuit is not used for at least part of the predetermined signal transmission path between the input and output of said input circuit.

11. An integrated circuit according to claim 9, wherein the predetermined signal transmission functions of said input circuit and that of said output circuit are logic functions.

12. An integrated circuit according to claim 11, wherein the logic functions of said input and output circuits are inverter functions.

13. An integrated circuit according to claim 9, wherein the rest of said external connection pads other than said one external connection pad among a plurality of said external connection pads includes first and second pads; said first pad is connected to the input of said input circuit formed so as to correspond to said first pad; the output of said input circuit is transmitted to said internal circuit without passing through the predetermined signal transmission path of said output circuit formed so as to correspond to said second pad; and the output of said output circuit is transmitted to said second pad without passing through the predetermined signal transmission path of said input circuit formed so as to correspond to said second pad.

14. An integrated circuit according to claim 9, 10, 11, 12 or 13, wherein said internal circuit is disposed at the center on the main plane of said substrate which is rectangular; a plurality of each of said input and output circuits are disposed around said internal circuit; and a plurality of said external connection pads are disposed around the four sides of said substrate in such a manner as to correspond to the pairs of said input and output circuits.

* * * * *